(12) United States Patent
Chu

(10) Patent No.: US 8,931,972 B2
(45) Date of Patent: Jan. 13, 2015

(54) THERMAL MODULE MOUNT STRUCTURE

(75) Inventor: Yen-Lin Chu, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 1023 days.

(21) Appl. No.: 12/536,495

(22) Filed: Aug. 6, 2009

(65) Prior Publication Data

US 2011/0030919 A1 Feb. 10, 2011

(51) Int. Cl.
*F16B 21/02* (2006.01)
*H01L 23/467* (2006.01)
*F04D 25/06* (2006.01)
*F04D 29/60* (2006.01)

(52) U.S. Cl.
CPC .......... *H01L 23/467* (2013.01); *F04D 25/0613* (2013.01); *F04D 29/601* (2013.01)
USPC ............................. 403/348; 403/353; 361/697

(58) Field of Classification Search
CPC ... H01L 23/467; H01L 23/40; H01L 23/4093; G06F 1/20; F16B 21/02; F16B 21/04
USPC ................. 403/348, 349, 350, 353, 306, 314; 316/697, 694, 695; 174/16.3; 248/176.2, 315, 346.5; 361/697, 694, 361/695
See application file for complete search history.

(56) References Cited

U.S. PATENT DOCUMENTS

| 5,579,827 | A  | * | 12/1996 | Chung .......................... 165/80.3 |
| 6,538,888 | B1 |   | 3/2003  | Wei et al. |
| 7,100,676 | B2 | * | 9/2006  | Li et al. ......................... 165/80.3 |
| 7,286,350 | B2 | * | 10/2007 | Lee et al. ....................... 361/695 |
| 7,423,880 | B1 | * | 9/2008  | Tang ............................. 361/709 |
| 7,583,503 | B2 | * | 9/2009  | Lin ............................... 361/704 |
| 2005/0111191 | A1 | * | 5/2005 | Lee et al. ....................... 361/704 |
| 2006/0045737 | A1 | * | 3/2006 | Wung et al. .................... 415/220 |
| 2009/0161314 | A1 | * | 6/2009 | Liu ............................... 361/697 |
| 2009/0166011 | A1 | * | 7/2009 | Xu ................................ 165/121 |

* cited by examiner

*Primary Examiner* — Joshua Kennedy
*Assistant Examiner* — Jonathan Masinick
(74) *Attorney, Agent, or Firm* — C. G. Mersereau; Nikolai & Mersereau, P.A.

(57) ABSTRACT

A thermal module mount structure including a first mount body and a second mount body. The first mount body defines therein a first passage and has multiple engaging sections inward extending into the first passage. The second mount body is disposed in the first passage and has multiple complementary engaging sections complementary to the engaging sections. Each of the complementary engaging sections has a moving space and multiple engaging splits in communication therewith. The second mount body is vertically displaceable within the first passage, whereby the first and second mount bodies can be relatively rotated to insert the engaging sections into the engaging splits at different heights. Accordingly, the height of the mount structure is changeable by means of adjusting the second mount body in accordance with different heights of radiating fins. Therefore, the mount structure has high commonness so that the cost for developing the molds is reduced.

8 Claims, 8 Drawing Sheets

THERMAL MODULE MOUNT STRUCTURE

FIELD OF THE INVENTION

The present invention relates generally to a mount structure, and more particularly to a thermal module mount structure, which is adjustable in height in accordance with different heights of radiating fins. Therefore, the thermal module mount structure has high commonness so that the cost for developing the molds is reduced.

BACKGROUND OF THE INVENTION

Following the rapid advance of electronic and information technologies, all kinds of electronic products (such as desktop computers and notebook computers) have been more and more popularly used and widely applied to various fields. As exemplified with a computer, there is a trend to increase processing speed and expand access capacity of the central processing unit (CPU) of the computer. Consequently, the CPU operates at higher and higher speed and at the same time generates heat at higher and higher heating power.

In operation, the electronic components in electronic equipment will inevitably generate high heat to cause rise of temperature. Therefore, the electronic equipment must be equipped with a heat dissipation unit, such as a thermal module, to dissipate the heat at high efficiency. Otherwise, the electronic components may malfunction or even burn out due to overheating. A conventional thermal module is composed of a radiating fin assembly or a heat sink and a cooperative cooling fan. The cooling fan serves to forcedly dissipate heat from the heat sink to enhance heat dissipation efficiency as a whole. The radiating fin assembly or heat sink must be securely arranged on the heat-generating electronic components so as to effectively conduct and dissipate heat.

Please refer to FIGS. 1 and 2. A conventional thermal module includes a mount structure having a mount body 1. The mount body 1 has an upper face 11 on which a cooling fan 2 is disposed. The mount body 1 further has a lower end formed with an enclosure section 12. The radiating fins 3 are attached to a heat-generating component and accommodated in the enclosure section 12 of the mount body 1. However, only one single size of radiating fins 3 can be received in the enclosure section 12 of the mount body 1, while other radiating fins with different sizes are incompatible with the mount body 1. Accordingly, the mount body 1 has low compatibility and it is necessary to develop various molds for different sizes of mount bodies adaptable to different radiating fins with different sizes. Therefore, the mount body 1 has low commonness and the cost for developing the molds is high.

According to the aforesaid, the conventional thermal module mount structure has the following shortcomings:
1. The mount body has low commonness.
2. The cost for developing the molds is high.

SUMMARY OF THE INVENTION

A primary object of the present invention is to provide a thermal module mount structure, which is adjustable in height in accordance with different heights of radiating fins. Therefore, the thermal module mount structure has high commonness and is applicable to various radiating fins of different sizes.

A further object of the present invention is to provide the above thermal module mount structure, which is applicable to different sizes of heat sinks so that the cost for developing the molds is reduced.

To achieve the above and other objects, the thermal module mount structure of the present invention includes a first mount body and a second mount body. The first mount body defines therein a first passage and has multiple engaging sections inward extending into the first passage. The second mount body is disposed in the first passage and has multiple complementary engaging sections complementary to the engaging sections. Each of the complementary engaging sections has a moving space and multiple engaging splits in communication therewith. The second mount body is vertically displaceable within the first passage, whereby the first and second mount bodies can be relatively rotated to insert the engaging sections into the engaging splits at different heights. Accordingly, the height of the mount structure is changeable by means of adjusting the second mount body in accordance with different heights of radiating fins. Therefore, the mount structure has high commonness so that the cost for developing the molds is reduced.

BRIEF DESCRIPTION OF THE DRAWINGS

The structure and the technical means adopted by the present invention to achieve the above and other objects can be best understood by referring to the following detailed description of the preferred embodiment and the accompanying drawings, wherein.

DETAILED DESCRIPTION OF THE PREFERRED EMBODIMENT

Figure 1:
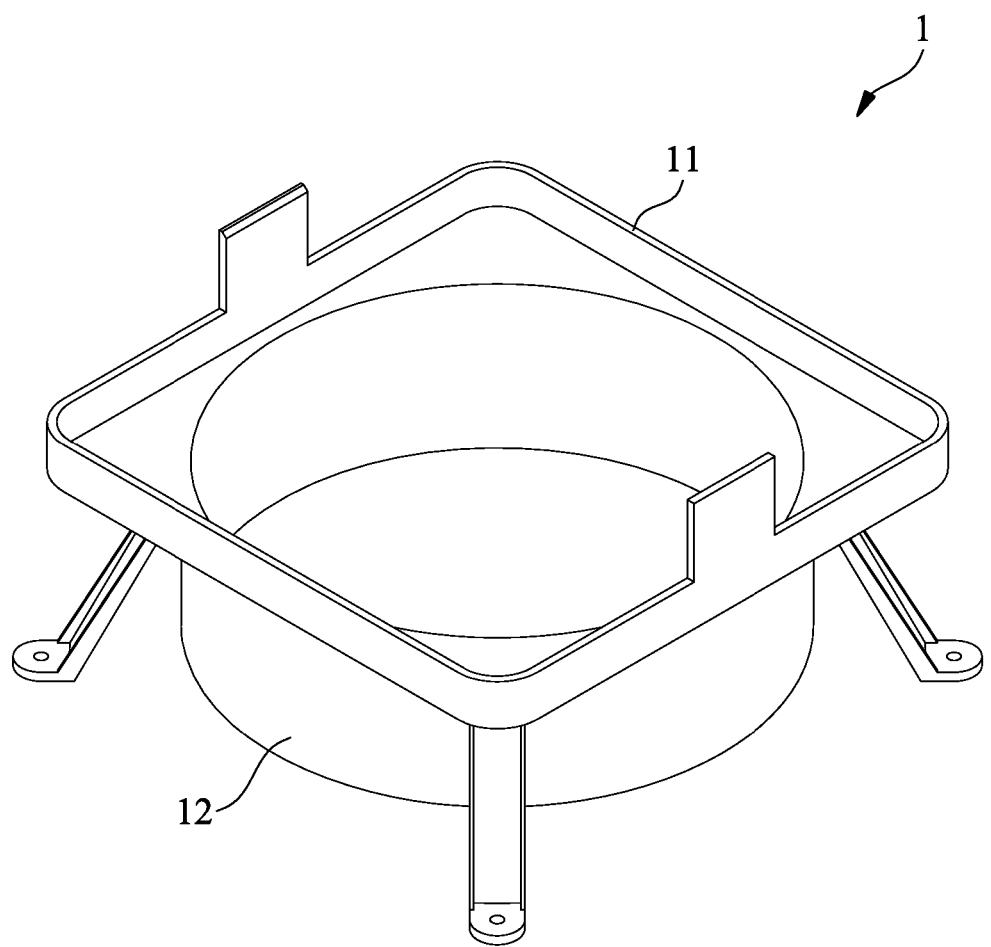
FIG. 1 is a perspective view of a conventional thermal module mount structure.
Figure 2:
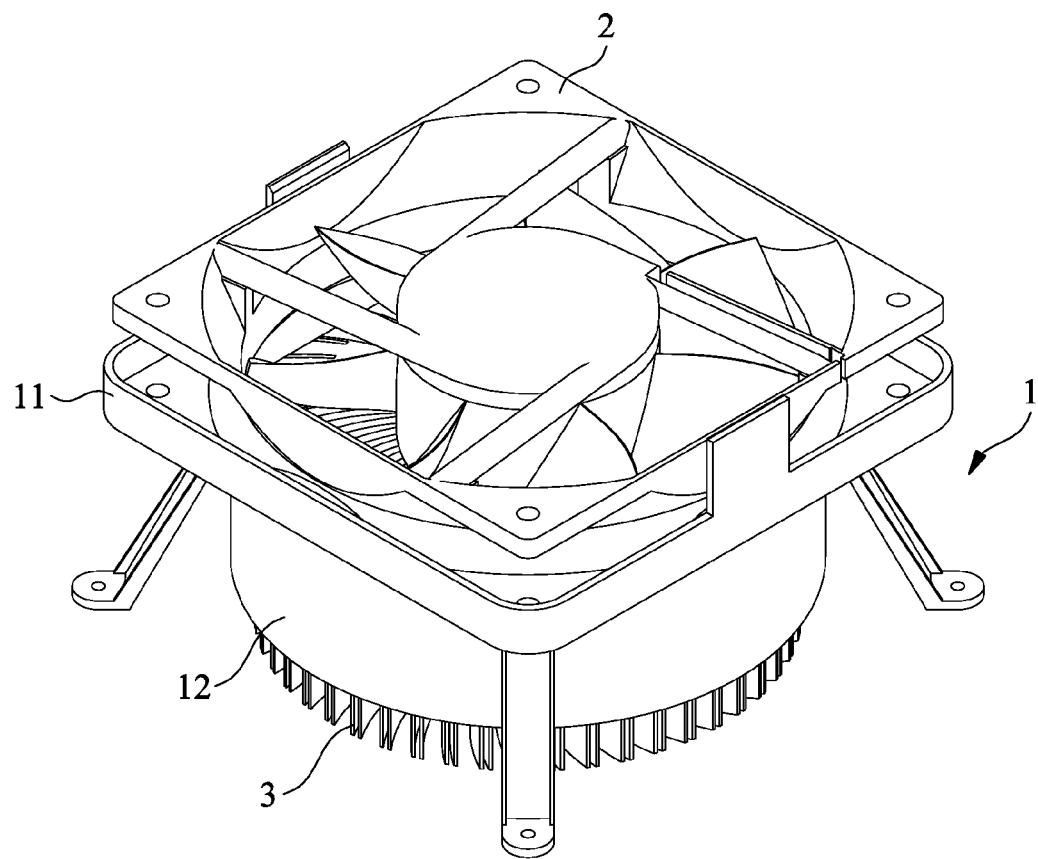
FIG. 2 is a perspective view of the conventional thermal module mount structure, showing the application thereof.
Figure 3:
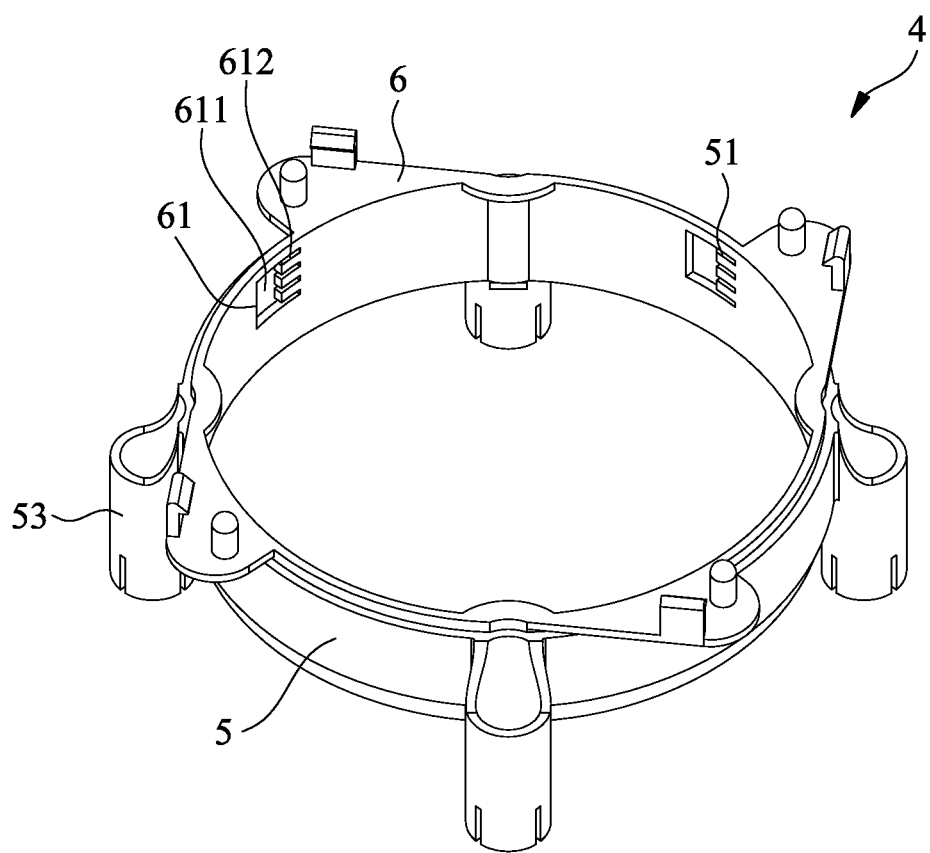
FIG. 3 is a perspective assembled view of a preferred embodiment of the thermal module mount structure of the present invention.
Figure 4:
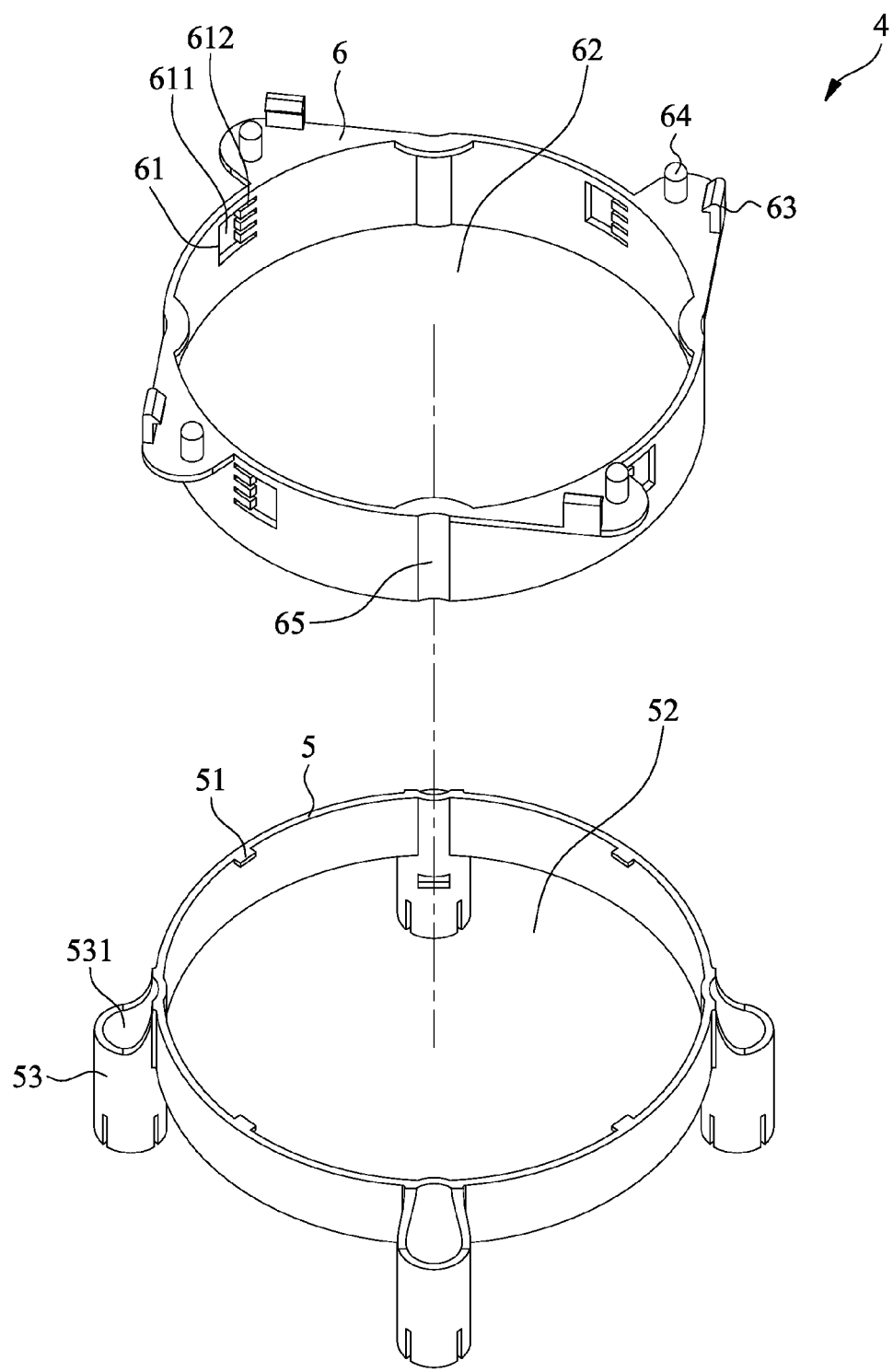
FIG. 4 is a perspective exploded view of the preferred embodiment of the thermal module mount structure of the present invention.

Please refer to FIGS. 3 and 4. According to a preferred embodiment, the thermal module mount structure 4 of the present invention includes a first mount body 5 and a second mount body 6. The first mount body 5 has multiple engaging sections 51. The first mount body 5 defines therein a first passage 52. The engaging sections 51 inward extend into the first passage 52. In addition, the first mount body 5 has multiple rest sections 53 arranged on outer circumference of the first mount body 5. Each rest section 53 has a through hole 531. The second mount body 6 is rested in the first passage 52 of the first mount body 5. The second mount body 6 has multiple complementary engaging sections 61 each having a moving space 611 and multiple engaging splits 612 in communication with the moving space 611. The second mount body 6 defines therein a second passage 62. In addition, multiple latch sections 63, multiple locating members 64 and multiple recessed sections 65 are arranged on outer circumference of the second mount body 6. The rest sections 53 on the outer circumference of the first mount body 5 can be connected to the recessed sections 65.

Figure 5:
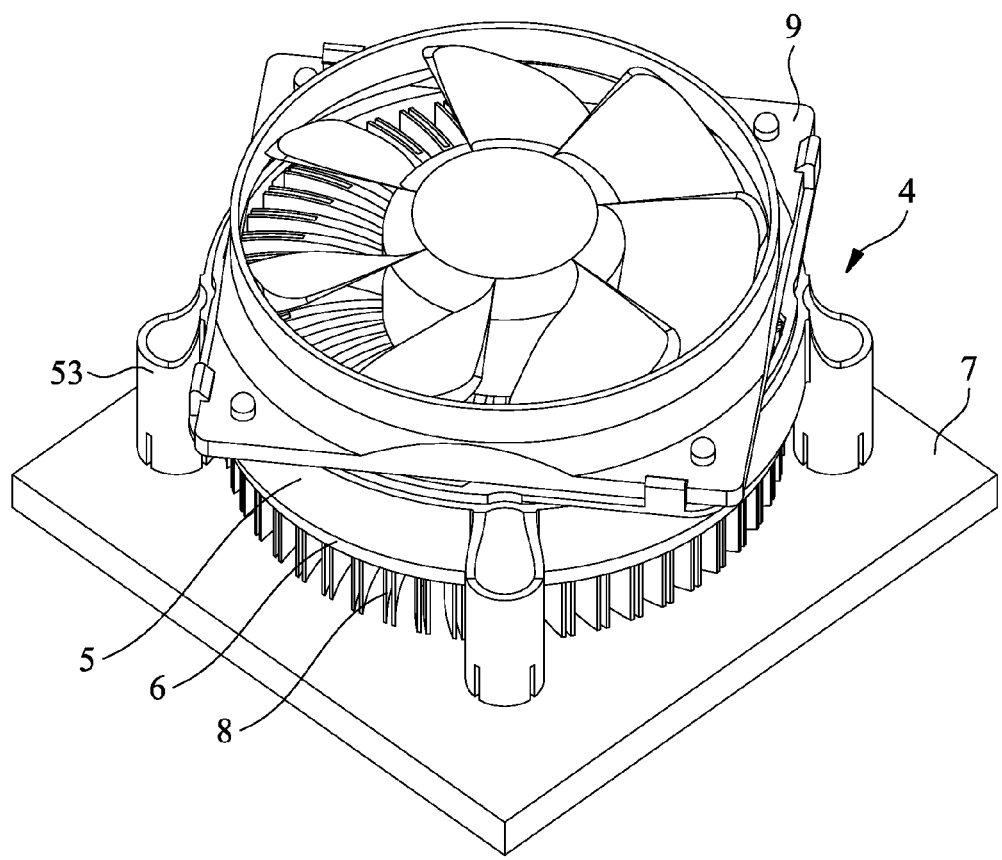
FIG. 5 is a perspective view showing that multiple radiating fins and a cooling fan are mounted on the thermal module mount structure of the present invention.

Please now refer to FIGS. 4 and 5. FIG. 4 is a perspective exploded view of the preferred embodiment of the thermal module mount structure of the present invention and FIG. 5 is a perspective view showing that multiple radiating fins 8 and a cooling fan 9 are mounted on the thermal module mount structure of the present invention. The first mount body 5 is mounted on a heat-generating unit 7 with the rest sections 53 connected thereto. Locking members (not shown) can be passed through the through holes 531 of the rest sections 53 to lock the first mount body 5 on the heat-generating unit 7. The second mount body 6 is positioned in the first passage 52 of the first mount body 5. The second mount body 6 has an outer diameter equal to or slightly smaller than an inner diameter of the first mount body 5. The engaging sections 51 of the first mount body 5 are correspondingly engaged with the complementary engaging sections 61 of the second mount body 6. The engaging sections 51 are positioned in the moving spaces 611 of the complementary engaging sections 61 and horizontally displaced from the moving spaces 611 into the engaging splits 612. Accordingly, in this embodiment, the first mount body 5 is fixedly disposed on the heat-generating unit 7 via the rest sections 53. The engaging sections 51 of the first mount body 5 are engaged in the engaging splits 612 of the second mount body 6 at a greater height. The radiating fins 8 as a heat sink are received in the second mount body 6 between the second mount body 6 and the heat-generating unit 7. The heat sink 8 has a size adapted to the space defined by the first mount body 5 and the second mount body 6, whereby the heat sink 8 can be securely disposed between the second mount body 6 and the heat-generating unit 7. Moreover, the outer circumference of the second mount body 6 has recessed sections 65 for guiding and fixing the rest sections 53 of the first mount body 5. Therefore, the second mount body 6 can be securely located on the first mount body 5. By means of the latch sections 63 and locating members 64 arranged on the outer circumference of the second mount body 6, the cooling fan 9 can be located on the second mount body 6. Accordingly, the heat sink 8 and the cooling fan 9 can be fixedly located on the heat-generating unit 7 by means of the mount structure 4 to dissipate heat generated by the heat-generating unit 7. The mount structure 4 of the present invention is applicable to various heat sinks with different sizes so that the cost for developing the molds can be reduced.

Figure 6A:
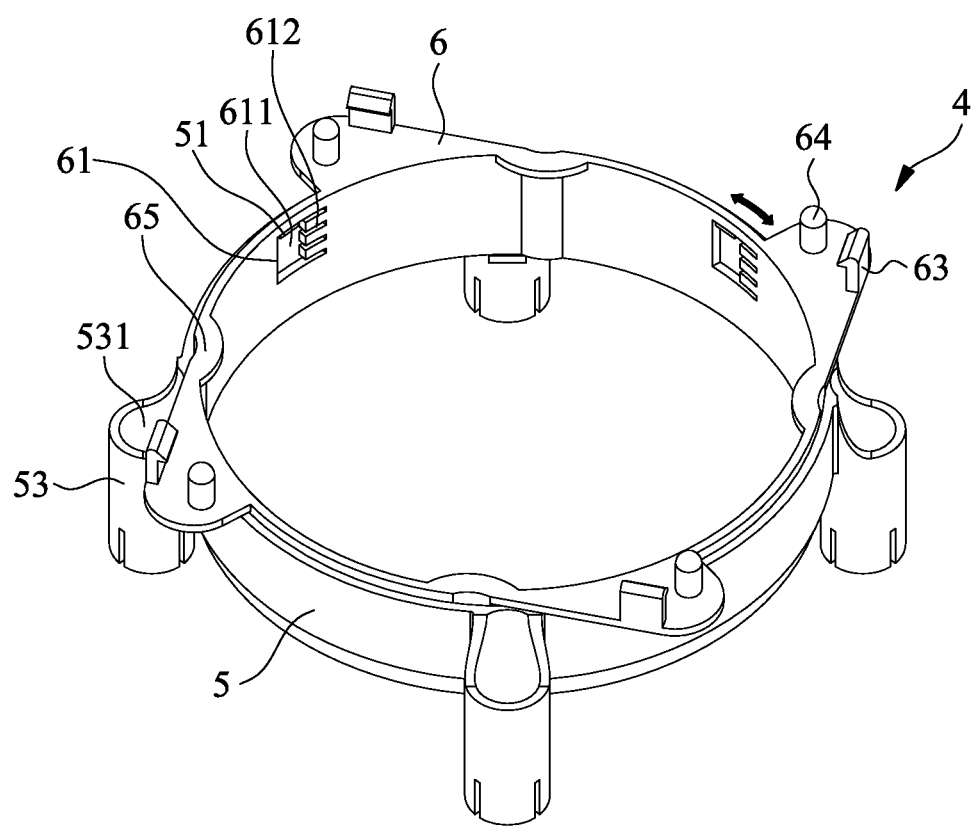
FIG. 6A is a perspective view showing that the height of the thermal module mount structure of the present invention is adjusted in a first stage.
Figure 6B:
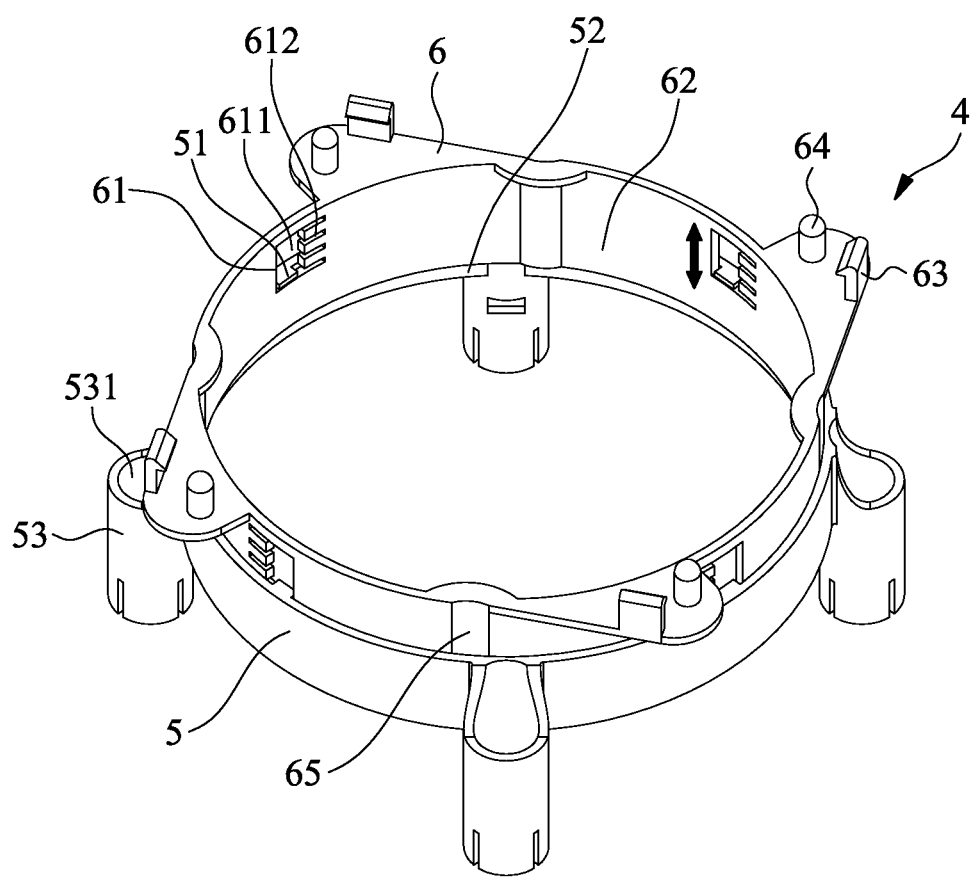
FIG. 6B is a perspective view showing that the height of the thermal module mount structure of the present invention is adjusted in a second stage.
Figure 7:
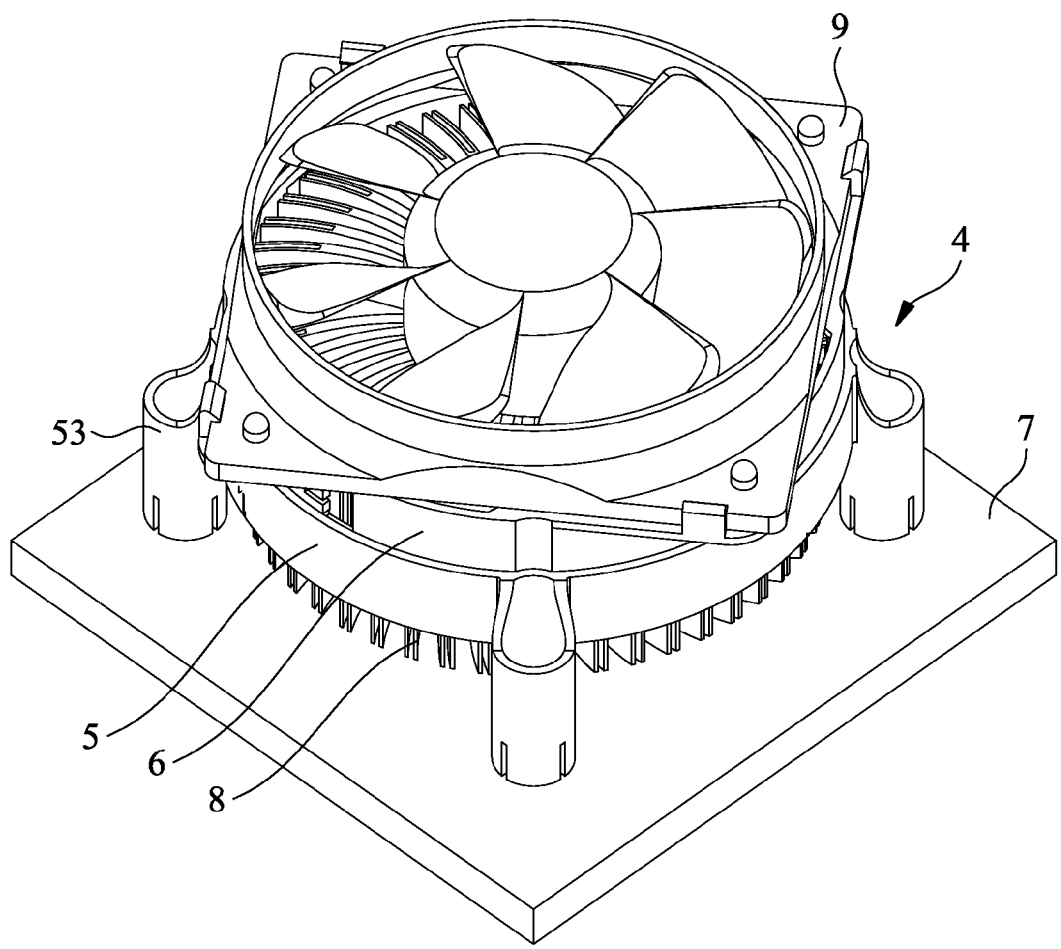
FIG. 7 is a perspective view showing that multiple radiating fins and the cooling fan are mounted on the thermal module mount structure of the present invention after adjusted.

Please now refer to FIGS. 6A, 6B and 7. FIG. 6A is a perspective view showing that the height of the thermal module mount structure of the present invention is adjusted in a first stage. FIG. 6B is a perspective view showing that the height of the thermal module mount structure of the present invention is adjusted in a second stage. FIG. 7 is a perspective view showing that the heat sink 8 and the cooling fan are mounted on the thermal module mount structure of the present invention after adjusted. Different heat-generating units necessitate different sizes of heat sinks. In the case a heat sink 8 of a different size is located on the heat-generating unit 7, the height of the receiving space of the mount structure 4 can be changed by means of adjusting the second mount body 6. The first mount body 5 of the mount structure 4 is locked on the heat-generating unit 7 and the second mount body 6 is supported on the first mount body 5. The engaging sections 51 of the first mount body 5 are engaged in the engaging splits 612 of the complementary engaging sections 61 of the second mount body 6. When adjusting the second mount body 6 in accordance with a different size of heat sink 8, the second mount body 6 is rotated in a direction away from the engaging sections 51 of the first mount body 5 to disengage the engaging sections 51 from the engaging splits 612. At this time, the engaging sections 51 are displaced to the moving spaces 611.

Under such circumstance, the second mount body 6 can be vertically moved to adjust the height of the mount structure 4 in accordance with the height of the heat sink 8. In this embodiment, the second mount body 6 is raised to an uppermost position where the engaging sections 51 are aligned with the lowermost engaging splits 612. Then the second mount body 6 is rotated in a direction to the engaging sections 51 of the first mount body 5, whereby the engaging sections 51 are engaged into the lowermost engaging splits 612. At the same time, the recessed sections 65 on the outer circumference of the second mount body 6 are restored to the position of the rest sections 53 of the first mount body 5. Accordingly, the second mount body 6 can be securely located on the first mount body 5 with the engaging sections 51 fixedly engaged in the engaging splits 612. In the case, the heat sink 8 can be firmly disposed in the first and second passages 52, 62. By means of the latch sections 63 and locating members 64 arranged on the outer circumference of the second mount body 6, the cooling fan 9 can be located on the second mount body 6. Accordingly, the mount structure 4 of the present invention is applicable to various heat sinks 8 with different sizes so that the cost for developing the molds can be reduced.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A thermal module comprising:
a first mount body having multiple spaced engaging ions, the first mount body defining therein a first passage, said first mount body having mounting means to mount said first mount body directly on a heat generating unit and wherein said mounting means includes multiple rest sections arranged in spaced relation on an outer circumference of the first mount body, each of the rest sections having a through hole and being characterized by a corresponding inward projection projecting into said first passage in said first mount body;
a second mount body disposed in the first passage of the first mount body, the second mount body having multiple circumferentially spaced recesses and multiple spaced complementary engaging sections, said engaging sections of the second mount body complementary to the engaging sections of the first mount body, each of the spaced complementary engaging sections of the second mount body having multiple engaging splits spaced at different heights, wherein the first and second mount bodies can be rotated relative to each other to engage or disengage the engaging sections of the first mount body with respect to the engaging splits of the second mount body and when the engaging sections and the engaging splits are disengaged it allows the first and second mount bodies to move freely up and down with respect to each other to change the engaging sections of the first mount body directly from the height of one of the engaging splits to that of another selected engaging split thereby enabling direct adjustment of the height of said second mount body relative to said first mount body, and wherein when the engaging sections of the first mount body are engaged with the engaging splits of the second mount body, the inward projections of the rest sections of the first mount body are seated within the spaced recesses of the second mount body; and a heat sink having: a plurality of radiating fins of a height to which the height of the space defined by the first mount body and the second mount body can be adjusted, so that the heat sink can be securely disposed between the second mount body and the heat generating unit, the height of the space defined by the first mount body and the second mount body being adjustable by means of rotation of the first mount body relative to the second mount body.

2. The thermal module as claimed in claim 1, wherein the engaging sections inwardly extend into the first passage.

3. The thermal module as claimed in claim 1, wherein each of the complementary engaging sections has a moving space in communication with the engaging splits.

4. The thermal module as claimed in claim 3, wherein the second mount body is vertically displaceable within the first passage and the engaging sections are vertically displaceable within the moving spaces, whereby the first and second mount bodies can be rotated relative to each other to insert the engaging sections into the engaging splits.

5. The thermal module as claimed in claim 1, wherein multiple latch sections are arranged on an outer circumference of the second mount body.

6. The thermal module as claimed in claim 1, wherein multiple locating members are arranged on an outer circumference of the second mount body.

7. The thermal module as claimed in claim 1, wherein the second mount body defines therein a second passage.

8. The thermal module as claimed in claim 1, wherein multiple recessed sections are arranged on an outer circumference of the second mount body, the recessed sections being connectable to the rest sections arranged on the outer circumference of the first mount body to securely assemble the first and second mount bodies with each other.

\* \* \* \* \*